United States Patent
Wen et al.

(10) Patent No.: US 9,955,598 B1
(45) Date of Patent: Apr. 24, 2018

(54) CLAMPING APPARATUS FOR PORTABLE ELECTRONIC DEVICE

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Chao-Ping Wen, Shenzhen (CN); Zhou Chen, Shenzhen (CN); Tao Jiang, Shenzhen (CN); Tai-Shan Zhu, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/637,551

(22) Filed: Jun. 29, 2017

(30) Foreign Application Priority Data

May 5, 2017 (CN) .......................... 2017 1 0313033

(51) Int. Cl.
 *A47G 1/10* (2006.01)
 *H05K 5/02* (2006.01)
 *H05K 7/14* (2006.01)
 *F16M 11/04* (2006.01)
 *F16B 2/10* (2006.01)

(52) U.S. Cl.
 CPC ......... *H05K 5/0204* (2013.01); *H05K 7/1428* (2013.01); *F16B 2/10* (2013.01); *F16M 11/041* (2013.01)

(58) Field of Classification Search
 CPC ...... F16B 2/12; F16B 2/14; F16B 2/06; F16B 2/04

USPC ........ 248/689, 229.12, 229.22, 228.3, 230.3, 248/231.41, 316.4, 316.2, 229.24, 229.21, 248/229.25, 229.15, 229.14; 316/679.55, 316/679.56

See application file for complete search history.

(56) References Cited

U.S. PATENT DOCUMENTS

| 5,555,302 A * | 9/1996 | Wang ................. B60R 11/0241 379/426 |
| 5,836,563 A * | 11/1998 | Hsin-Yung .......... B60R 11/0241 248/316.4 |
| 5,903,645 A * | 5/1999 | Tsay .................... B60R 11/0241 248/316.4 |
| 7,537,190 B2 * | 5/2009 | Fan ........................ B60R 11/02 248/309.1 |

(Continued)

*Primary Examiner* — Terrell L McKinnon
*Assistant Examiner* — Michael McDuffie
(74) *Attorney, Agent, or Firm* — ScienBiziP, P.C.

(57) ABSTRACT

An apparatus to clamp and support a device includes a chassis, two clamping members, an elastic element, a driving pole, a cam, and a cover. The chassis includes a blocking tab. The two clamping members include a first clamping member and a second clamping member. The elastic element is located in a receiving hole. The driving pole is rotatable relative to the chassis. The cam can engage with the driving pole, and includes a first cam flange abutting to a first engaging post of the first clamping member. The cover is mounted to the chassis. The two clamping members and the cam are located between the chassis and the cover. The cam is rotated by the driving pole. The first cam flange urges the first engaging post to move the first clamping member away from the second clamping member.

20 Claims, 6 Drawing Sheets

(56) References Cited

U.S. PATENT DOCUMENTS

| | | | |
|---|---|---|---|
| 7,967,269 B2 * | 6/2011 | Liu | G03B 21/58 |
| | | | 248/176.3 |
| 8,567,737 B2 * | 10/2013 | Chen | F16M 11/041 |
| | | | 248/313 |
| 8,638,557 B2 * | 1/2014 | Tsai | F16M 11/041 |
| | | | 248/919 |
| 8,727,192 B2 * | 5/2014 | Lai | B60R 11/0241 |
| | | | 224/282 |
| 8,833,716 B2 * | 9/2014 | Funk | F16M 13/02 |
| | | | 248/309.1 |
| 9,038,977 B2 * | 5/2015 | Nemoto | B60R 11/0211 |
| | | | 248/27.1 |
| 9,115,843 B2 * | 8/2015 | Huang | F16M 11/08 |
| 9,797,543 B2 * | 10/2017 | Lin | F16M 11/041 |
| 2007/0045495 A1 * | 3/2007 | Asano | B60R 11/0241 |
| | | | 248/309.1 |
| 2009/0173863 A1 * | 7/2009 | Crown | B60R 11/0241 |
| | | | 248/316.4 |
| 2012/0126083 A1 * | 5/2012 | Nemoto | B60R 11/02 |
| | | | 248/316.4 |
| 2014/0042285 A1 * | 2/2014 | Carnevali | B60R 11/02 |
| | | | 248/316.4 |
| 2015/0060624 A1 * | 3/2015 | Huang | H05K 5/0204 |
| | | | 248/316.4 |
| 2016/0108942 A1 * | 4/2016 | Yu | F16M 13/00 |
| | | | 248/316.4 |

* cited by examiner

CLAMPING APPARATUS FOR PORTABLE ELECTRONIC DEVICE

FIELD

The subject matter herein generally relates to support structures, and particularly to a clamping apparatus for fixing portable electronic device.

BACKGROUND

To fix a portable electronic device, a clamping apparatus which can hold the portable electronic device in position is required. Portable electronic devices may have different sizes. A conventional clamping apparatus includes two pivotally connected clamps for clamping a portable electronic device within a predetermined size range. However, clamping range corresponding to the conventional clamping apparatus is limited by a pivot angle between the two clamps.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

Figure 1:
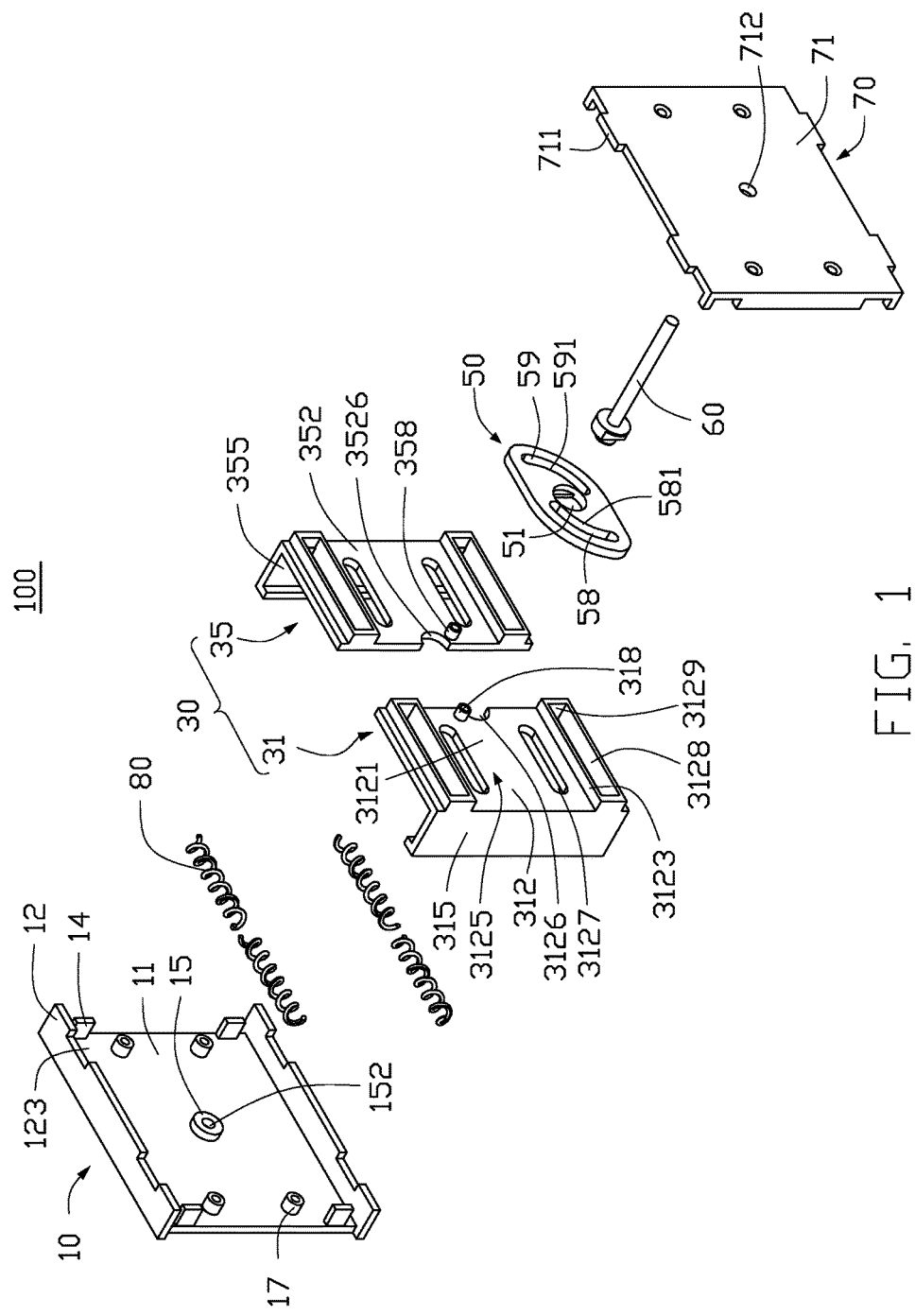
FIG. 1 is a diagrammatic view of a clamping apparatus in a first exemplary embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the configurations described herein. However, it will be understood by those of ordinary skill in the art that the configurations described herein can be practiced without these specific details. In other instances, methods, procedures, and components have not been described in detail so as not to obscure the related relevant feature being described. Also, the description is not to be considered as limiting the scope of the configurations described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

FIG. 1 illustrates a clamping apparatus 100 in a first exemplary embodiment. The clamping apparatus 100 can clamp a portable electronic device 200 (shown in FIG. 5), such as a smart phone, or a tablet computer. In the first exemplary embodiment, the portable electronic device 200 is a smart phone.

Figure 2:
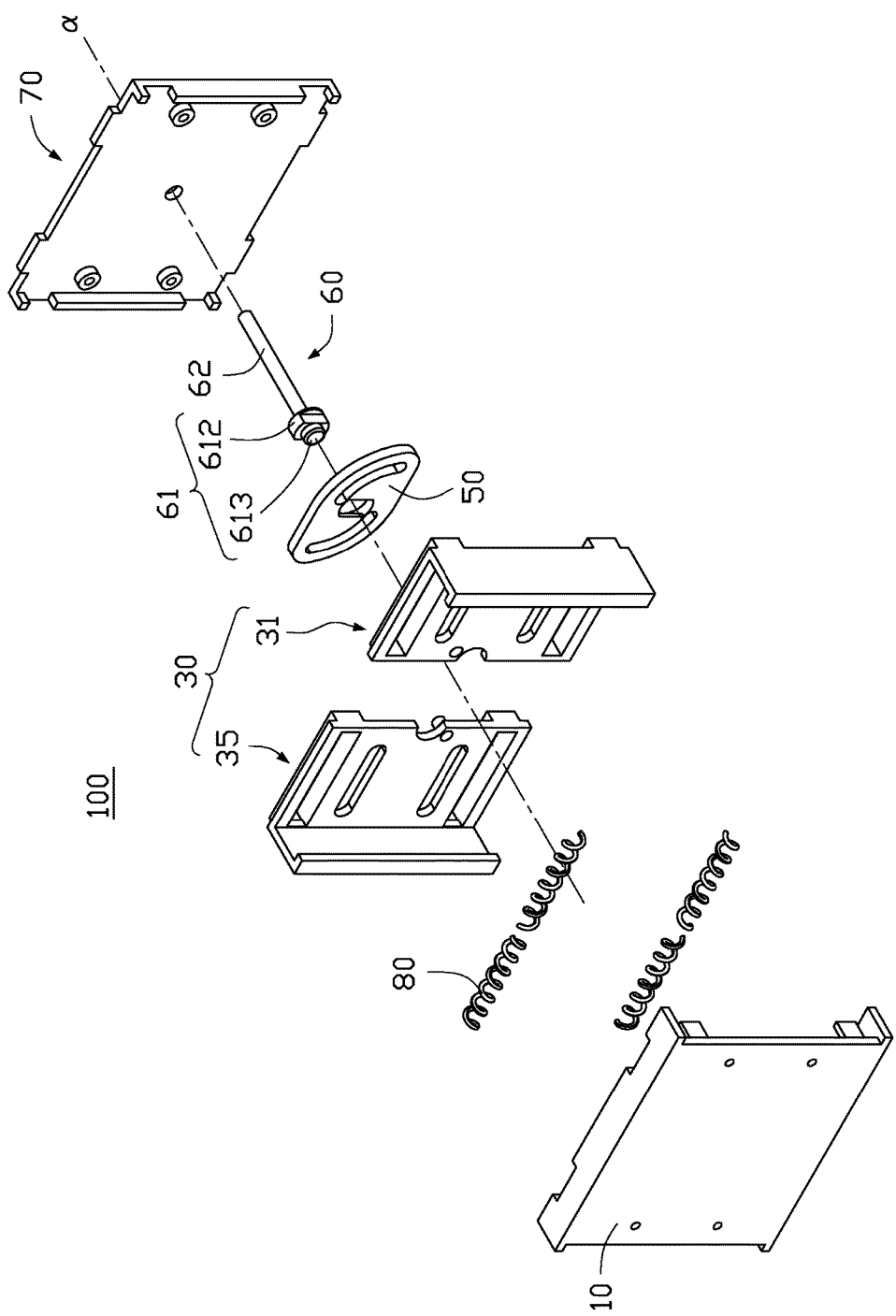
FIG. 2 is similar to FIG. 1, but shown from another aspect.

FIG. 2 illustrates another view of the clamping apparatus 100 in the first exemplary embodiment. The clamping apparatus 100 includes a chassis 10, two clamping members 30, a cam 50, a driving pole 60, a plurality of elastic elements 80, and a cover 70.

In the first exemplary embodiment, the chassis 10 includes a bottom wall 11 and two shielding flanges 12 extending perpendicularly from opposites sides of the bottom wall 11. Two cutouts 123 are defined in each shielding flange 12. A mounting post 15 protrudes from a central portion of the bottom wall 11. The mounting post 15 defines a pivot hole 152. The chassis 10 further includes four blocking tabs 14 and four blocking posts 17. The four blocking tabs 14 are located at four corners of the bottom wall 11. Each blocking tab 14 is substantially perpendicular to the bottom wall 11 and the two shielding flanges 12.

In the first exemplary embodiment, the two clamping members 30 include a first clamping member 31 and a second clamping member 35. The first clamping member 31 includes a first main body 312, a first clamping portion 315 extending from the first main body 312, and a first engaging post 318. The first main body 312 includes a base wall 3121 and two receiving portions 3123 located on opposite sides of the base wall 3121. A receiving space 3125 is defined between the two receiving portions 3123 and the base wall 3121. Two sliding slots 3127 are defined in the base wall 3121. The two sliding slots 3127 are parallel to each other. A receiving hole 3128 is defined in each receiving portion 3123. A cross sectional view of each receiving hole 3128 is substantially rectangular. Each receiving portion 3123 includes a blocking portion 3129 on one side of each receiving hole 3128. A first opening 3126 is defined in substantially a middle portion of the base wall 3121 away from the first clamping portion 315. The first opening 3126 can be semicircular. The first clamping portion 315 is substantially perpendicular to the first main body 312. The first engaging post 318 is located on the base wall 3121 within the receiving space 3125.

The second clamping member 35 includes a second main body 352, a second clamping portion 355 extending from the second main body 352, and a second engaging post 358. The second main body 352 and the second clamping portion 355 substantially and respectively mirror the first main body 312 and the first clamping portion 315. The second engaging post 358 protrudes from the second main body 352. A second opening 3526 is defined in the second main body 352 corresponding to the first opening 3126. The second opening 3526 can be semicircular.

In the first exemplary embodiment, a central hole 51, a first cam slot 58, and a second cam slot 59 are defined in the cam 50. The first cam slot 58 and the second cam slot 59 are symmetrical about a central point of the central hole 51. The central hole 51 is substantially rectangular. The cam 50 includes a first cam flange 581 and a second cam flange 591, the first cam flange 581 is located on one side of the first cam slot 58 adjacent to the central hole 51, and the second cam flange 591 is located on one side of the second cam slot 59 adjacent to the central hole 51.

In the first exemplary embodiment, the driving pole 60 includes an engaging member 61 and a rod 62, the engaging member 61 includes a mounting portion 612 and a pivot tab 613. In cross section, the mounting portion 612 is substantially rectangular. The mounting portion 612 can engage with the central hole 51 to drive the cam 50 to rotate. A distal end of the rod 62 is connected to the mounting portion 612. The pivot tab 613 is located away from the rod 62. The driving pole 60 can drive the cam 50 to rotate about an axis α.

In the first exemplary embodiment, the cover 70 includes a rear wall 71. The rear wall 71 includes a plurality of locking portions 711 corresponding to the cutouts 123. A through hole 712 is defined in a central portion of the rear wall 71 corresponding to the pivot hole 152 of the chassis 10.

In the first exemplary embodiment, four elastic elements 80 can be employed. Each elastic element 80 can be a coil spring.

Figure 3:
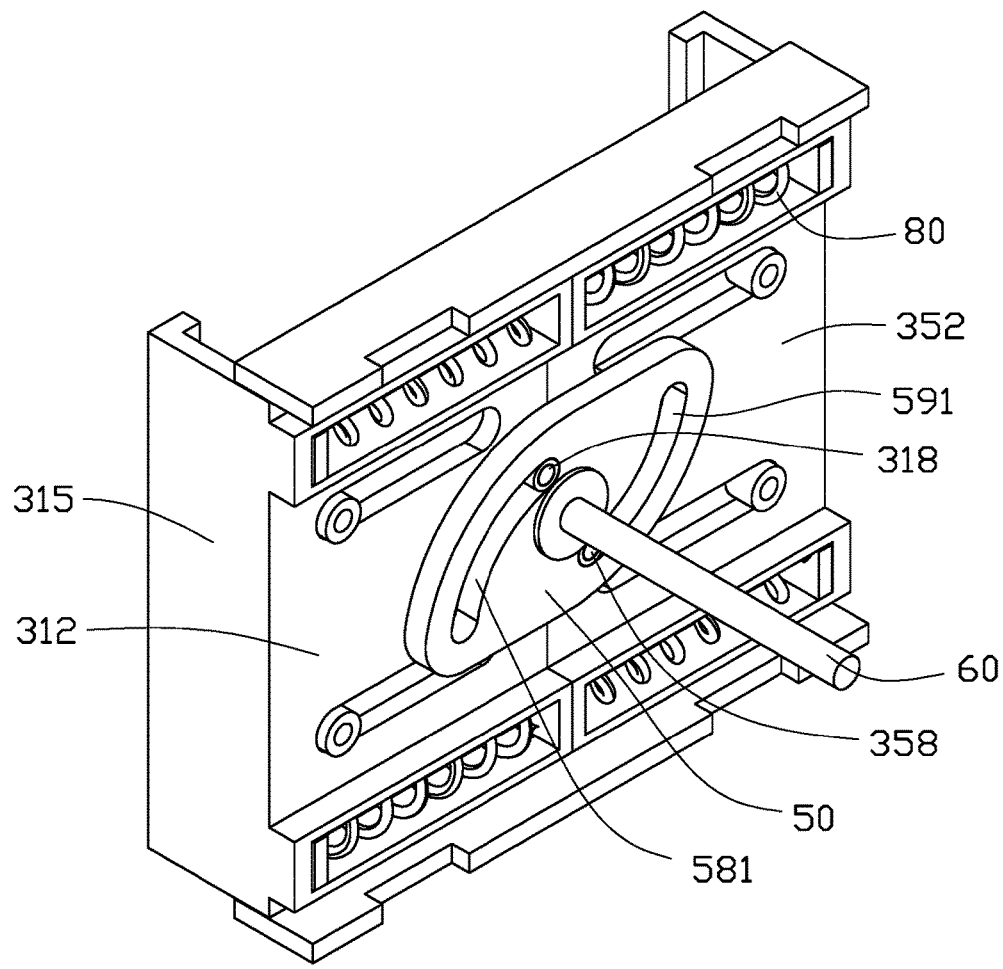
FIG. 3 is a diagrammatic view of the clamping apparatus in the first exemplary embodiment, the clamping apparatus being in an original state.
Figure 4:
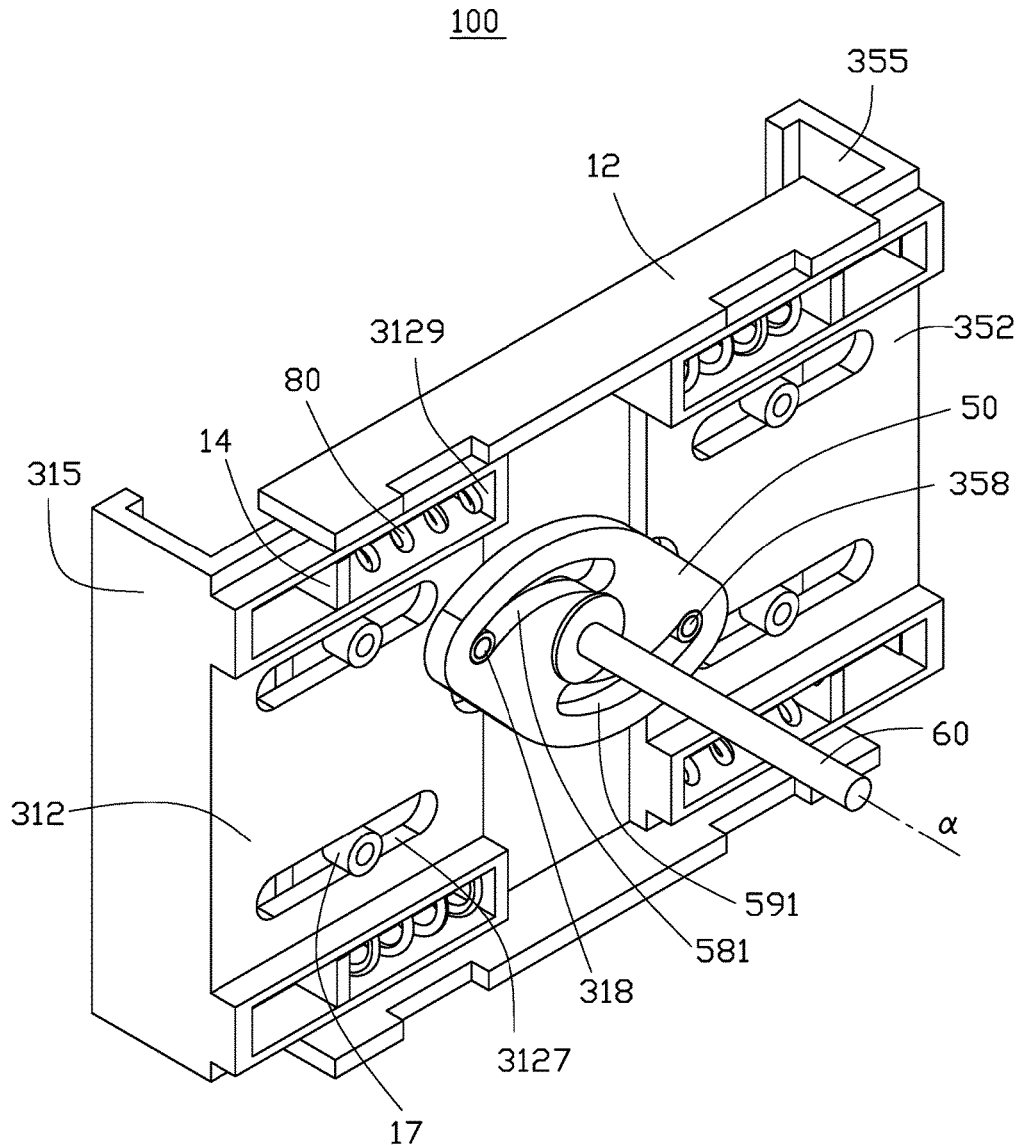
FIG. 4 is similar to FIG. 3, but the clamping apparatus being in an extended state.
Figure 5:
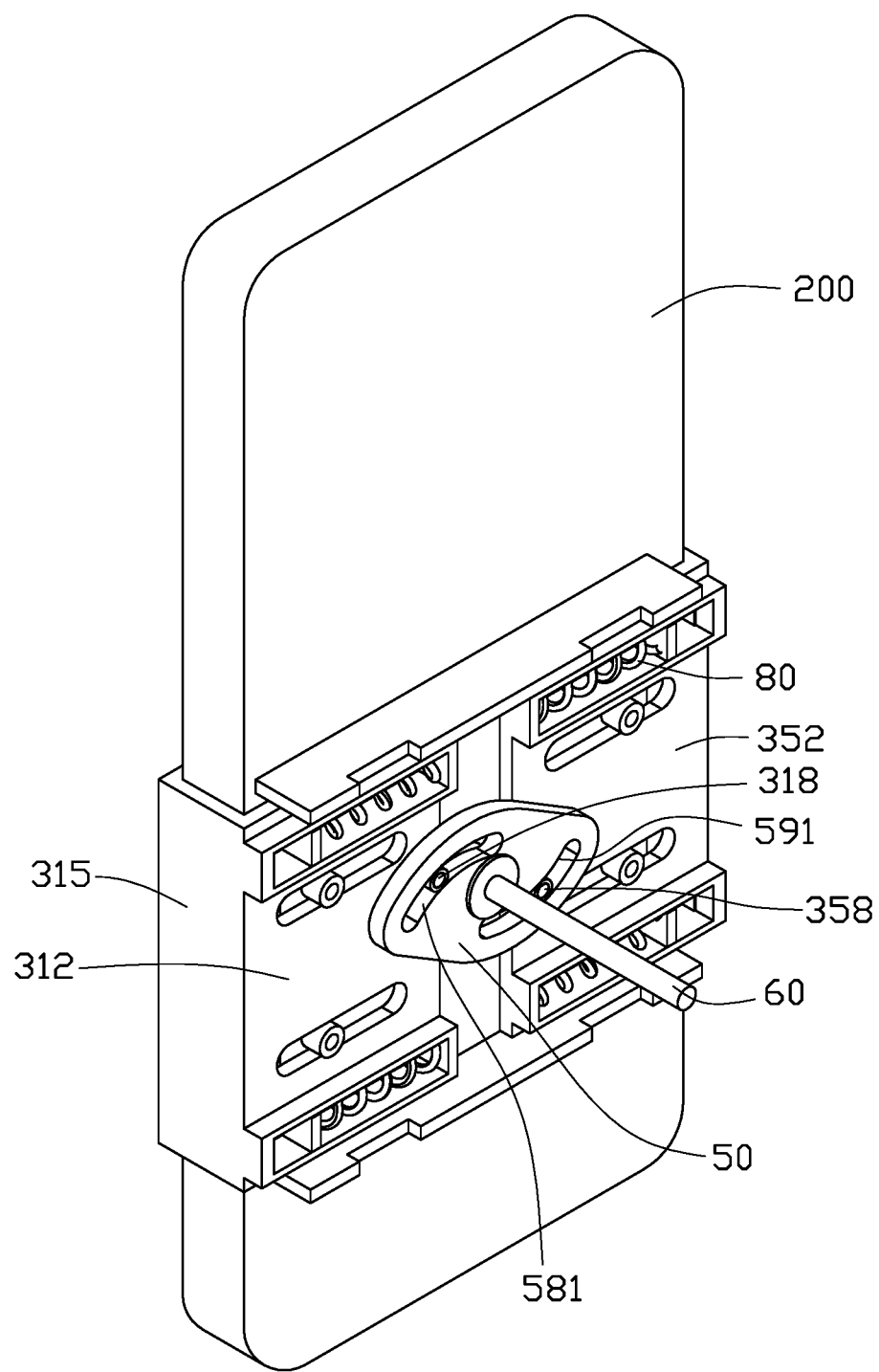
FIG. 5 is a diagrammatic view of the clamping apparatus in the first exemplary embodiment, the clamping apparatus clamping a portable electronic device.

Referring to FIG. 3 to FIG. 5, in assembly, the two clamping members 30 are slidably mounted on the chassis 10, the four blocking tabs 14 extend into the corresponding receiving holes 3128 of the two clamping members 30. The four blocking posts 17 extend into the corresponding sliding slots 3127. The mounting post 15 is located in a circular hole defined by the first opening 3126 and the second opening 3526. The four elastic elements 80 are located in the four receiving holes 3128. Each elastic element 80 is sandwiched between the corresponding blocking portion 3129 and the corresponding blocking tab 14. The two clamping members 30 are located between the two shielding flanges 12 of the chassis 10. The first clamping portion 315 and the second clamping portion 355 extend out from the chassis 10 to clamp the portable electronic device 200. The cam 50 is located in the receiving space 3125 between the two clamping members 30. The first engaging post 318 and the second engaging post 358 extend into the corresponding first cam slot 58 and the second cam slot 59. The mounting portion 612 engages with the central hole 51, the pivot tab 613 is rotatable in the pivot hole 152. The cover 70 is mounted on the chassis 10. The four locking portions 711 of the cover 70 are engaged with the corresponding cutouts 123 of the chassis 10. The driving pole 60 extends out from the through hole 712 of the cover 70.

After the clamping apparatus 100 is assembled, the clamping apparatus 100 is in an original and unextended state. In the original state, the first clamping member 31 abuts the second clamping member 35. The first engaging post 318 is located at one end of the first cam slot 58 adjacent to the second cam slot 59. The second engaging post 358 is located at one end of the second cam slot 59 adjacent to the first cam slot 58. The four elastic elements 80 are located in the corresponding receiving holes 3128, and are in an uncompressed state.

In use, by rotating the driving pole 60 clockwise, the cam 50 is driven to rotate. The first cam flange 581 pushes the first engaging post 318 to move along a first linear direction. The second cam flange 591 pushes the second engaging post 358 to move along a second linear direction opposite to the first linear direction. The elastic elements 80 are elastically compressed. During the operation, the first clamping member 31 moves from a first position to a second position. In the first position, the first clamping member 31 abuts the second clamping member 35. The first engaging post 318 is located at one end of the first cam slot 58 adjacent to the second cam slot 59. The second engaging post 358 is located at one end of the second cam slot 59 adjacent to the first cam slot 58. The four elastic elements 80 are uncompressed. In the second position, the first clamping member 31 is moved away from the second clamping member 35. The first engaging post 318 is located at another end of the first cam slot 58 away from the second cam slot 59. The second engaging post 358 is located at another end of the second cam slot 59 away from the first cam slot 58. The four elastic elements 80 are compressed. A distance between the first clamping portion 315 and the second clamping portion 355 in the first position is smaller than a distance between the first clamping portion 315 and the second clamping portion 355 in the second position. A distance between the first engaging post 318 and the axis α in the first position is smaller than a distance between the first engaging post 318 and the axis α in the second position. The portable electronic device 200 is then positioned between the two clamping members 30. The driving pole 60 is released, the elastic elements 80 recover, the two clamping members 30 are driven to move toward each other, and the portable electronic device 200 is thereby clamped.

Figure 6:
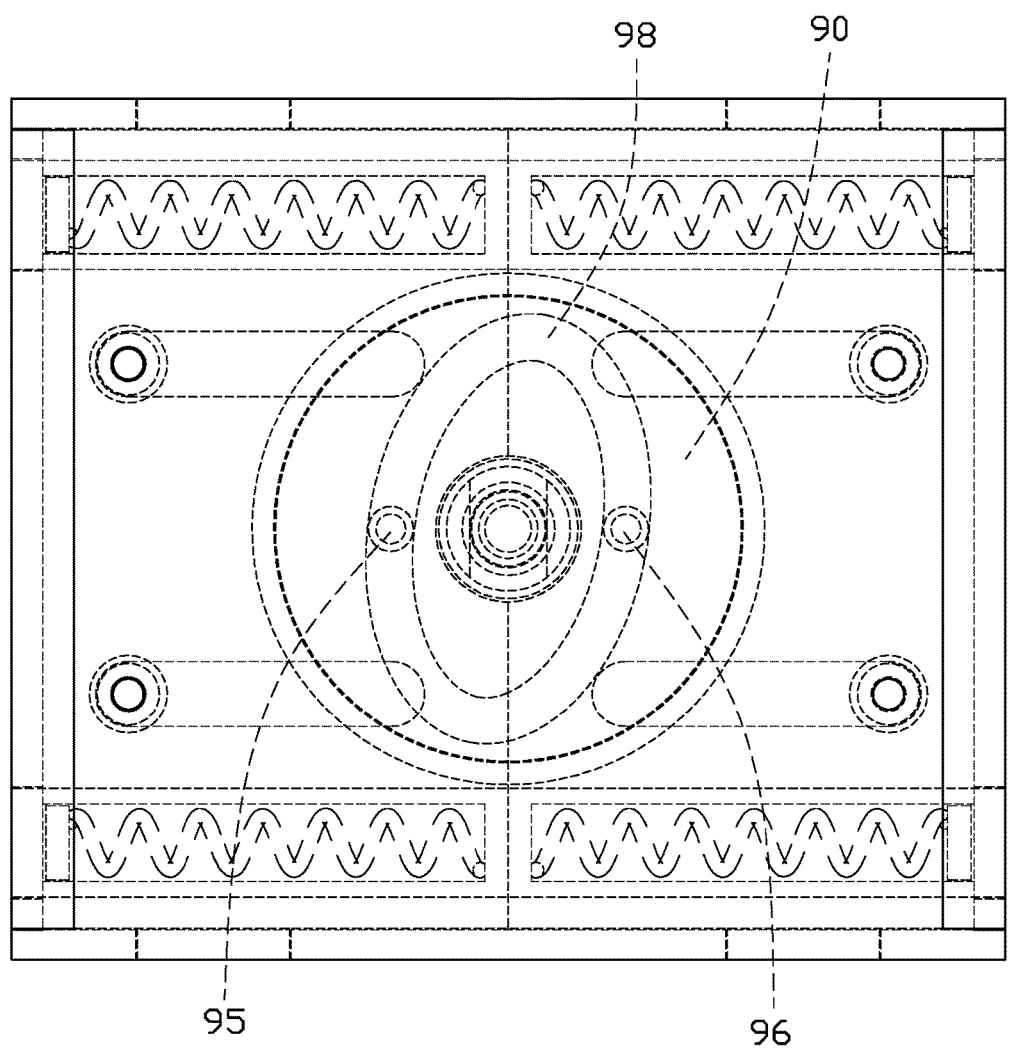
FIG. 6 is a diagrammatic view of a clamping apparatus in a second exemplary embodiment.

FIG. 6 illustrates a clamping apparatus 300 in a second exemplary embodiment. Differences between the clamping apparatus 300 and 100 relate to the configuration of the cam. The clamping apparatus 300 includes a cam 90, and the cam 90 defines a circular cam slot 98. The circular cam slot 98 can be more than equal to the combination of first cam slot 58 and second cam slot 59 in function. The circular cam slot 98 can be oval. The clamping apparatus 300 includes a first engaging post 95 and a second engaging post 96 to couple to the circular cam slot 98. In use, the cam 90 can push the two clamping members to move clockwise or counterclockwise.

In other exemplary embodiments, at least one clamping member can be move relative to the chassis. For example, the first clamping member 31 can be moved relative to the chassis 10, and the second clamping member 35 can be fixed. The cam 50 can define only one cam slot, such as the first cam slot 51.

In other exemplary embodiments, at least one sliding slot 3127 and at least one receiving portion 3123 can be defined in the first clamping member 31.

The configurations shown and described above are only examples. Many details are often found in the art such as the other features of a clamping apparatus. Therefore, many such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the configurations described above may be modified within the scope of the claims.

What is claimed is:

1. A clamping apparatus, comprising:
   a chassis comprising a blocking post and a blocking tab;
   two clamping members comprising:
   a first clamping member, comprising a first main body, a first clamping portion extending from the first main body, and a first engaging post; the first main body comprising a receiving portion, a sliding slot defined in the first main body, the blocking post extending into the sliding slot; a receiving hole defined in the receiving portion, the receiving portion comprising a blocking portion on one side of the receiving hole; the blocking tab extending into the receiving hole; and a second clamping member, comprising a second main body and a second clamping portion extending from the second main body;

an elastic element located in the receiving portion, the elastic element located in the receiving hole;

a driving pole rotatable relative to the chassis;

a cam engaging with the driving pole, and comprising a first cam flange abutting to the first engaging post; and a cover mounting to the chassis, and the two clamping members and the cam being located between the chassis and the cover;

wherein the cam is rotated driven by the driving pole, the first cam flange is configured to urge the first engaging post to move the first clamping member away from the second clamping member.

2. The clamping apparatus of claim 1, wherein the first clamping member is moved from a first position to a second position, a distance between the first clamping portion and the second clamping portion in the first position is smaller than a distance between the first clamping portion and the second clamping portion in the second position; the cam is configured to rotate about an axis, and a distance between the first engaging post and the axis in the first position is smaller than a distance between the first engaging post and the axis in the second position.

3. The clamping apparatus of claim 2, wherein the second clamping member comprises a second engaging post protruding from the second main body, the second engaging post and the first engaging post are symmetrical about the axis; the cam further comprises a second cam flange abutting to the second engaging post, the second cam flange and the first cam flange are symmetrical about the axis, the second cam flange is configured to urge the second engaging post to move the second clamping member away from the first clamping member.

4. The clamping apparatus of claim 3, wherein a central hole is defined in the cam; the driving pole comprises an engaging member, the engaging member is engaged with the central hole to drive the cam to rotate.

5. The clamping apparatus of claim 4, wherein a first opening is defined in the first main body, the first opening is semicircular, a second opening is defined in the second main body, the second opening is semicircular, the driving pole extends through the first opening and the second opening.

6. The clamping apparatus of claim 5, wherein the chassis comprises a mounting post, the mounting post extends into the first opening and the second opening, a mounting hole is defined in the mounting post, and the engaging member comprises a pivot tab for engaging with the mounting post.

7. The clamping apparatus of claim 3, wherein a first cam slot and a second cam slot are defined in the cam, the first cam flange is located on one side of the first cam slot adjacent to the axis, the second cam flange is located on one side of the second cam slot adjacent to the axis, and the first cam slot and the second cam slot are symmetrical about the axis.

8. The clamping apparatus of claim 7, wherein the first cam slot and the second cam slot are connected end to end to define a circular cam slot.

9. The clamping apparatus of claim 1, wherein the first clamping portion is substantially perpendicular to the first main body, and the second clamping portion is substantially perpendicular to the second main body.

10. The clamping apparatus of claim 7, wherein the chassis further comprises a bottom wall and two shielding flanges perpendicularly extend from two opposite sides of the bottom wall, a cutout is defined in each of the two shielding flanges, the cover further comprises two locking portions for engaging with the two cutouts.

11. A clamping apparatus comprising:
a chassis comprising a blocking tab;
two clamping members comprising:
a first clamping member comprising a first main body, a first clamping portion extending from the first main body, and a first engaging post; the first main body comprising a receiving portion, a receiving hole defined in the receiving portion, the receiving portion comprising a blocking portion; the blocking tab extending into the receiving hole; and
a second clamping member comprising a second main body and a second clamping portion extending from the second main body;
an elastic element located in the receiving portion, the elastic element located in the receiving hole;
a driving pole rotatable relative to the chassis;
a cam engaging with the driving pole, and comprising a first cam flange abutting to the first engaging post; and
a cover mounting to the chassis, and the two clamping members and the cam being located between the chassis and the cover;
wherein the cam is rotated driven by the driving pole, the first cam flange is configured to urge the first engaging post to move the first clamping member away from the second clamping member.

12. The clamping apparatus of claim 11, wherein the first clamping member is moved from a first position to a second position, a distance between the first clamping portion and the second clamping portion in the first position is smaller than a distance between the first clamping portion and the second clamping portion in the second position; the cam is configured to rotate about an axis, and a distance between the first engaging post and the axis in the first position is smaller than a distance between the first engaging post and the axis in the second position.

13. The clamping apparatus of claim 12, wherein the second clamping member comprises a second engaging post protruding from the second main body, the second engaging post and the first engaging post are symmetrical about the axis; the cam further comprises a second cam flange abutting to the second engaging post, the second cam flange and the first cam flange are symmetrical about the axis, the second cam flange is configured to urge the second engaging post to move the second clamping member away from the first clamping member.

14. The clamping apparatus of claim 13, wherein a central hole is defined in the cam; the driving pole comprises an engaging member, the engaging member is engaged with the central hole to drive the cam to rotate.

15. The clamping apparatus of claim 14, wherein a first opening is defined in the first main body, the first opening is semicircular, a second opening is defined in the second main body, the second opening is semicircular, the driving pole extends through the first opening and the second opening.

16. The clamping apparatus of claim 15, wherein the chassis comprises a mounting post, the mounting post extends into the first opening and the second opening, a mounting hole is defined in the mounting post, and the engaging member comprises a pivot tab for engaging with the mounting post.

17. The clamping apparatus of claim 13, wherein a first cam slot and a second cam slot are defined in the cam, the first cam flange is located on one side of the first cam slot adjacent to the axis, the second cam flange is located on one side of the second cam slot adjacent to the axis, and the first cam slot and the second cam slot are symmetrical about the axis.

18. The clamping apparatus of claim 17, wherein the first cam slot and the second cam slot are connected end to end to define a circular cam slot.

19. The clamping apparatus of claim 11, wherein the first clamping portion is substantially perpendicular to the first main body, and the second clamping portion is substantially perpendicular to the second main body.

20. The clamping apparatus of claim 17, wherein the chassis further comprises a bottom wall and two shielding flanges perpendicularly extend from two opposite sides of the bottom wall, a cutout is defined in each of the two shielding flanges, the cover further comprises two locking portions for engaging with the two cutouts.

* * * * *